(12) United States Patent
Lee et al.

(10) Patent No.: US 7,804,725 B2
(45) Date of Patent: Sep. 28, 2010

(54) WRITE DRIVING CIRCUIT AND SEMICONDUCTOR MEMORY APPARATUS USING THE SAME

(75) Inventors: Jee Eun Lee, Ichon (KR); Mun Phil Park, Ichon (KR)

(73) Assignee: Hynix Semiconductor Inc. (KR)

( * ) Notice: Subject to any disclaimer, the term of this patent is extended or adjusted under 35 U.S.C. 154(b) by 185 days.

(21) Appl. No.: 11/966,273

(22) Filed: Dec. 28, 2007

(65) Prior Publication Data

US 2008/0212394 A1 Sep. 4, 2008

(30) Foreign Application Priority Data

Jan. 10, 2007 (KR) .................. 10-2007-0002746

(51) Int. Cl.
*G11C 7/22* (2006.01)
(52) U.S. Cl. ............... 365/189.16; 365/189.17; 365/203; 365/230.06
(58) Field of Classification Search ........... 365/189.16, 365/189.17, 189.14, 203, 230.03, 230.06
See application file for complete search history.

(56) References Cited

U.S. PATENT DOCUMENTS

| 5,629,900 | A | 5/1997 | Hirose et al. | |
|---|---|---|---|---|
| 6,058,068 | A | 5/2000 | Wilkins | |
| 6,172,918 | B1 | 1/2001 | Hidaka | |
| 7,054,204 | B2 | 5/2006 | Lim et al. | |
| 7,289,372 | B1 * | 10/2007 | Yu et al. | 365/189.16 |
| 2003/0117878 | A1 * | 6/2003 | Yamada | 365/230.03 |
| 2007/0073980 | A1 * | 3/2007 | Chung | 711/149 |

FOREIGN PATENT DOCUMENTS

| JP | 11-073763 | 3/1999 |
|---|---|---|
| JP | 2000173269 | 6/2000 |
| KR | 100261219 B1 | 4/2000 |

* cited by examiner

*Primary Examiner*—Tuan T Nguyen
*Assistant Examiner*—Toan Le
(74) *Attorney, Agent, or Firm*—Baker & McKenzie LLP

(57) ABSTRACT

A write driving circuit includes a plurality of driving units that write data corresponding to detection signals on memory banks, and at least one detecting unit that detects data input from the outside, and outputs the detection signals to two or more driving units among the plurality of driving units.

23 Claims, 7 Drawing Sheets

WRITE DRIVING CIRCUIT AND SEMICONDUCTOR MEMORY APPARATUS USING THE SAME

CROSS-REFERENCE TO RELATED PATENT APPLICATION

This application claims the benefit under 35 U.S.C. 119(a) of Korean Patent Application No. 10-2007-0002746, filed on Jan. 10, 2007, in the Korean Intellectual Property Office, the disclosure of which is incorporated herein in its entirety by reference as if set forth in full.

BACKGROUND

1. Technical Field

The embodiments described herein relate to a semiconductor circuit technique, and more particularly, to a write driving circuit and a semiconductor memory apparatus using the same.

2. Related Art

In general, as shown in FIG. 1, conventional semiconductor memory apparatus include a cell core, a bit line sense amplifier BLSA, switching transistors Ma and Mb, a write driver WDRV, and an IO sense amplifier IOSA.

The cell core is formed in a matrix of bit lines BL and BLB and word lines WL, and includes a plurality of cells each having transistors and capacitors connected to the bit lines BL and BLB and the word lines WL.

The bit line sense amplifier BLSA senses and amplifies data transmitted through the bit lines BL and BLB, and transmits the amplified data to local signal lines LIO and LIOB.

The switching transistors Ma and Mb connect the bit lines BL and BLB and the bit line sense amplifier BLSA according to a column selection signal 'YS', respectively.

The write driver WDRV transmits data that is transmitted from the outside of the semiconductor memory apparatus through global lines GIO and GIOB to the bit line sense amplifier 20 through the local signal lines LIO and LIOB.

The IO sense amplifier IOSA transmits data output from the cell core through the sense amplifier BLSA to the global signal lines GIO and GIOB.

Recent increases in the storage capacity of conventional semiconductor memory apparatus makes it difficult to control the entire cell core. Therefore, in order to improve the efficiency of control, the cell core is divided into a plurality of memory banks.

The memory bank may include some of the cells of the cell core, a circuit for writing or reading data on or from the cells, and signal lines, that is, components except for the cell core shown in FIG. 1.

For example, as shown in FIG. 2, a conventional semiconductor memory apparatus includes a plurality of memory banks (bank Nos. 0 to 3), a write driving circuit 200, global signal lines GIO and GIOB, and local signal lines LIO and LIOB.

The global signal lines GIO and GIOB are provided to transmit data input from the outside of the semiconductor memory apparatus to the write driving circuit 200. The local signal lines LIO and LIOB are provided to transmit data input to the write driving circuit 200 through the global signal lines GIO and GIOB to the plurality of memory banks (bank Nos. 0 to 3).

The write driving circuit 200 includes a plurality of write drivers WDRV. The write drivers WDRV are assigned to the corresponding memory banks (bank Nos. 0 to 3).

The number of write drivers WDRV used in each of the memory banks (bank Nos. 0 to 3) depends on an input/output structure and a prefetch method employed in a corresponding product. For example, when the input/output structure is ×32 and an 8-bit prefetch method is used, 256 write drivers WDRV are provided in each memory bank so that 256-bit data can be written with one write command. In addition, FIG. 2 shows a semiconductor memory apparatus having four memory banks. The number of banks depends on the capacity of the semiconductor memory apparatus.

Referring to FIG. 2, a plurality of write drivers 210 are assigned to bank No. 0, a plurality of write drivers 220 are assigned to bank No. 1, a plurality of write drivers 230 are assigned to bank No. 2, and a plurality of write drivers 240 are assigned to bank No. 3.

Each of the plurality of write drivers 210 to 240 have the same structure, and as shown in FIG. 3, the write driver 210 includes a detecting unit 211 and a driving unit 212.

The detecting unit 211 detects the levels of data transmitted through the global signal lines GIO and GIOB and outputs detection signals 'LAT', 'DRV', 'LATB', and 'DRVB'.

The driving unit 212 drives the local signal lines LIO and LIOB at the detected data level on the basis of the detection signals 'LAT', 'DRV', 'LATB', and 'DRVB', and pre-charges the local signal lines LIO and LIOB according to a pre-charge signal 'LIOPCG' and a bank write enable signal BWEN. The pre-charge signal 'LIOPCG' maintains the local signal lines LIO and LIOB at a bit line pre-charge voltage VBLP. The bank write enable signal 'BWEN' sets a write period.

Next, the operation of a conventional semiconductor memory apparatus, such as that illustrated in FIGS. 1-3, will be described in detail.

A write command is input from the outside of the semiconductor memory apparatus, and data corresponding to the write command is input to the global signal lines GIO and GIOB.

When the bank write enable signal 'BWEN' is activated at a high level, the detecting unit 211 detects data input to the global lines GIO and GIOB, and outputs the detection signals 'LAT', 'DRV', 'LATB', and 'DRVB'. The pre-charge signal 'LIOPCG' is deactivated at a low level during a period for which the bank write enable signal 'BWEN' is in an active state.

The driving unit 212 drives the local signal lines LIO and LIOB at the levels of the global signal lines GIO and GIOB according to the detection signals 'LAT', 'DRV', 'LATB', and 'DRVB'.

In the driving unit 212, when the pre-charge signal 'LIOPCG' is deactivated at a low level, or when the bank write enable signal 'BWEN' is activated at a high level, a NAND gate ND1 and an inverter IV8 output high-level and low-level signals, respectively.

When the NAND gate ND1 and the inverter IV8 output the high-level and low-level signals, respectively, transistors M17 to M22 are all turned off, so that the pre-charge operation stops.

Meanwhile, when the pre-charge signal 'LIOPCG' is activated at a high level, or when the bank write enable signal 'BWEN' is deactivated in a low level, the NAND gate ND1 and the inverter IV8 output low-level and high-level signals, respectively.

When the NAND gate ND1 and the inverter IV8 output the low-level and high-level signals, respectively, the transistors M17 to M22 are all turned on, so that the local signal lines LIO and LIOB are pre-charged with the bit line pre-charge voltage VBLP.

As mentioned, a conventional semiconductor memory apparatus includes a plurality of write drivers. Each of the write drives includes a circuit structure for detecting data and another circuit structure for driving data. Therefore, the write drivers take up a lot of space in the semiconductor memory apparatus, and the number of necessary write drivers increases as the capacity of the semiconductor memory apparatus becomes large. The space requirement associated with a conventional write driver makes it difficult to layout a conventional semiconductor memory apparatus, and causes a reduction in the efficiency of cells and a net die, and an increase in the size of the semiconductor memory apparatus.

SUMMARY

A write driving circuit capable of reducing the area of write drivers, and a semiconductor memory apparatus using the same are described herein.

According to one aspect, a write driving circuit includes a plurality of driving units that write data corresponding to detection signals on memory banks, and at least one detecting unit that detects data input from the outside, and outputs the detection signals to two or more driving units among the plurality of driving units.

According to another aspect, a semiconductor memory apparatus includes a plurality of memory banks, and a detecting-unit-sharing write driving circuit, which includes a plurality of driving units that are provided in each memory bank, and that write data on the corresponding memory bank using detection signals when the corresponding memory bank is activated, the number of driving units provided in each memory bank being equal to the number of bits of data written according to one write command. The semiconductor apparatus also includes detecting units that detect the data when any one of the plurality of memory banks is activated, and outputs the detection signals to the plurality of driving units, and a plurality of data lines through which the data is transmitted from the detecting-unit-sharing write driving circuit to the plurality of memory banks.

According to still another aspect, a semiconductor memory apparatus includes: N memory banks each having cells for data recording, and a write driving circuit that writes data on the N memory banks. In the semiconductor memory apparatus, the write driving circuit includes a plurality of driving units that are provided in each of the N memory banks, and that determine whether the corresponding memory bank is activated on the basis of first control signals, and that write the data on the corresponding memory bank according to detection signals, the number of driving units provided in each memory bank being equal to the number of bits of the data written according to one write command, and detecting units that determine whether the N memory banks are activated on the basis of second control signals, and output the detection signals. A detecting unit is provided for every N driving units among the plurality of driving units.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 4:
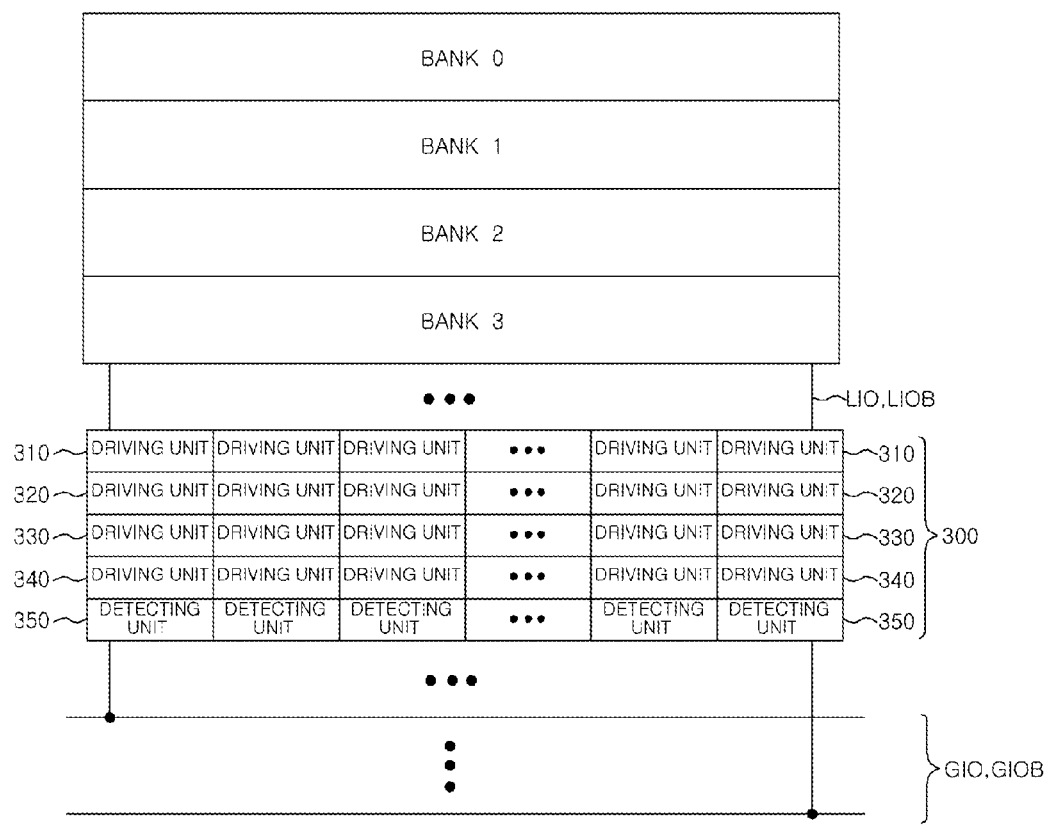
FIG. 4 is a block diagram illustrating an example semiconductor memory apparatus according to one embodiment.

FIG. 4 is a diagram illustrating an example semiconductor memory apparatus 301 according to one embodiment. As shown in FIG. 4, the semiconductor memory apparatus 301 can include a plurality of memory banks (bank Nos. 0 to 3) each having a plurality of cells for writing data, and a write driving circuit 300 configured to write data input from the outside of the semiconductor memory apparatus on the plurality of memory banks (bank Nos. 0 to 3).

The write driving circuit 300 can include a plurality of driving units 310 to 340 and a plurality of detecting units 350.

The plurality of driving units 310 to 340 can be provided in the corresponding memory banks (bank Nos. 0 to 3), and the number of driving units corresponding to each memory bank can be equal to the number of bits of data that is written according to a write command. The plurality of driving units 310 and 340 can be configured to determine whether the corresponding memory banks are activated according to a first control signal, and write data on the corresponding memory banks using a detection signal.

The detecting unit 350 can be provided for every four driving units among the plurality of driving units 310 to 340. The plurality of detecting units 350 can be configured to determine whether any one of the plurality of memory banks (bank Nos. 0 to 3) is activated according to a second control signal, detect data input from the outside of the semiconductor memory apparatus, and output the detection signal.

A pre-charge signal 'LIOPCG<0>' or a bank write enable signal 'BWEN<0>' can be used as the first control signal. When the pre-charge signal 'LIOPCG<0>' is deactivated or the bank write enable signal 'BWEN<0>' is activated, the pre-charging of local signal lines LIO and LIOB stops.

The driving units 310 to 340 can be configured to drive the local signal lines LIO and LIOB to a data level. However, when the local signal lines LIO and LIOB are in a pre-charged state, the driving units 310 to 340 cannot drive the local signal lines LIO and LIOB.

The pre-charge signal 'LIOPCG<0>' or the bank write enable signal 'BWEN<0>' can be used as the first control signal in order to determine that the local signal lines LIO and LIOB are not in the pre-charged state.

Bank write enable signals 'BWEN<0:3>' can be used as the second control signal.

The pre-charge signals 'LIOPCG<0:3>' and the bank write enable signals 'BWEN<0:3>' can be used to correspond to the plurality of memory banks (bank Nos. 0 to 3), respectively. The pre-charge signal 'LIOPCG<0>' and the bank write enable signal 'BWEN<0>' can be input to only the bank No. 0. The pre-charge signals 'LIOPCG<1:3>' and the bank write enable signals 'BWEN<1:3>' can be input to the banks Nos. 1 to 3, respectively.

Figure 1:
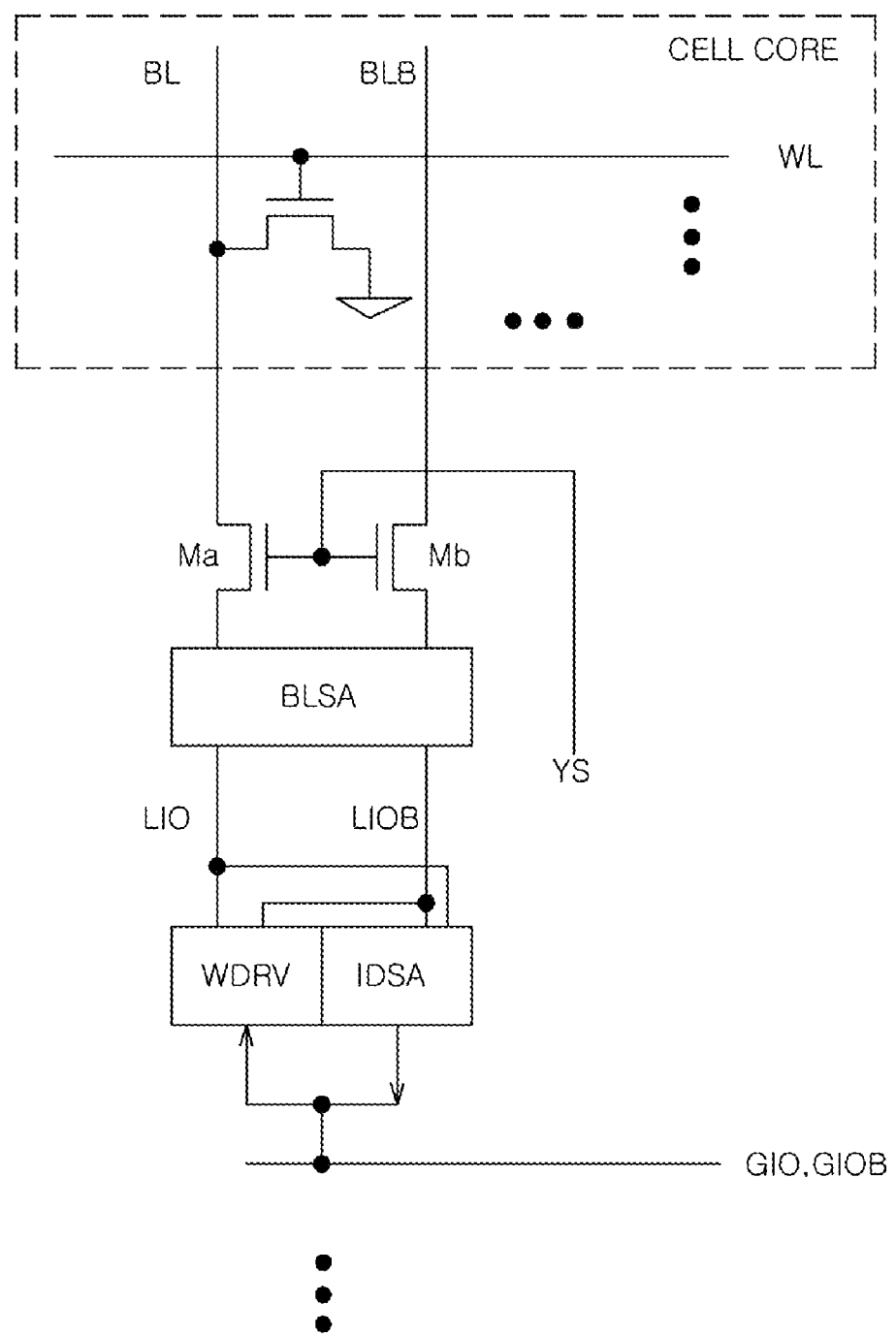
FIG. 1 is a block diagram illustrating an exemplary semiconductor memory apparatus.
Figure 2:
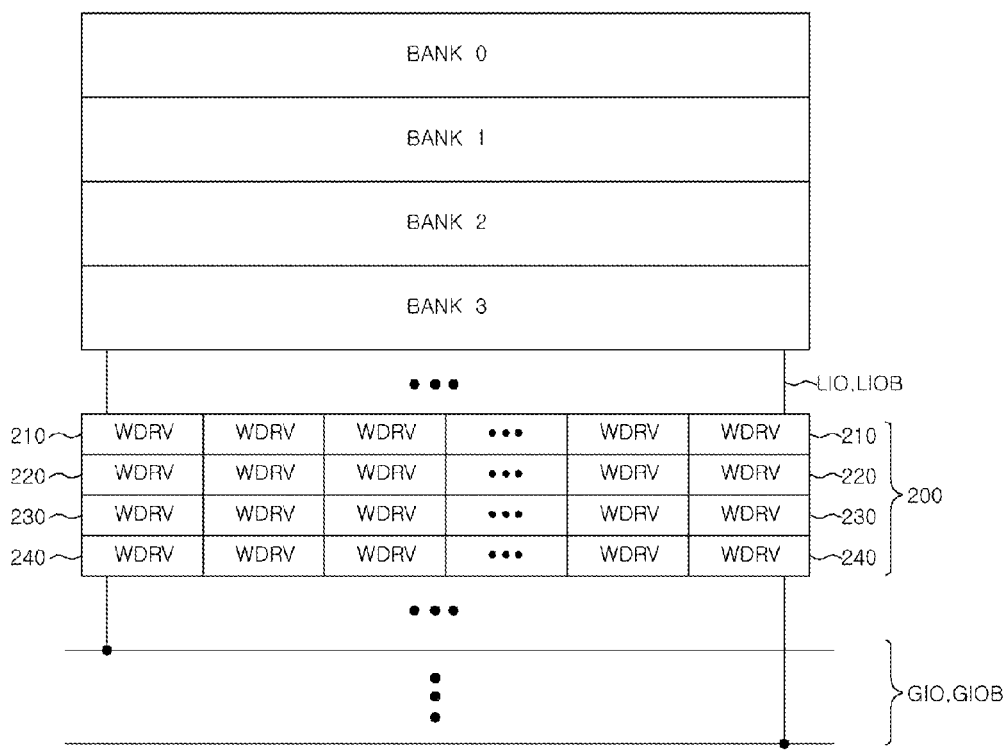
FIG. 2 is a block diagram illustrating another exemplary semiconductor memory apparatus.
Figure 3:
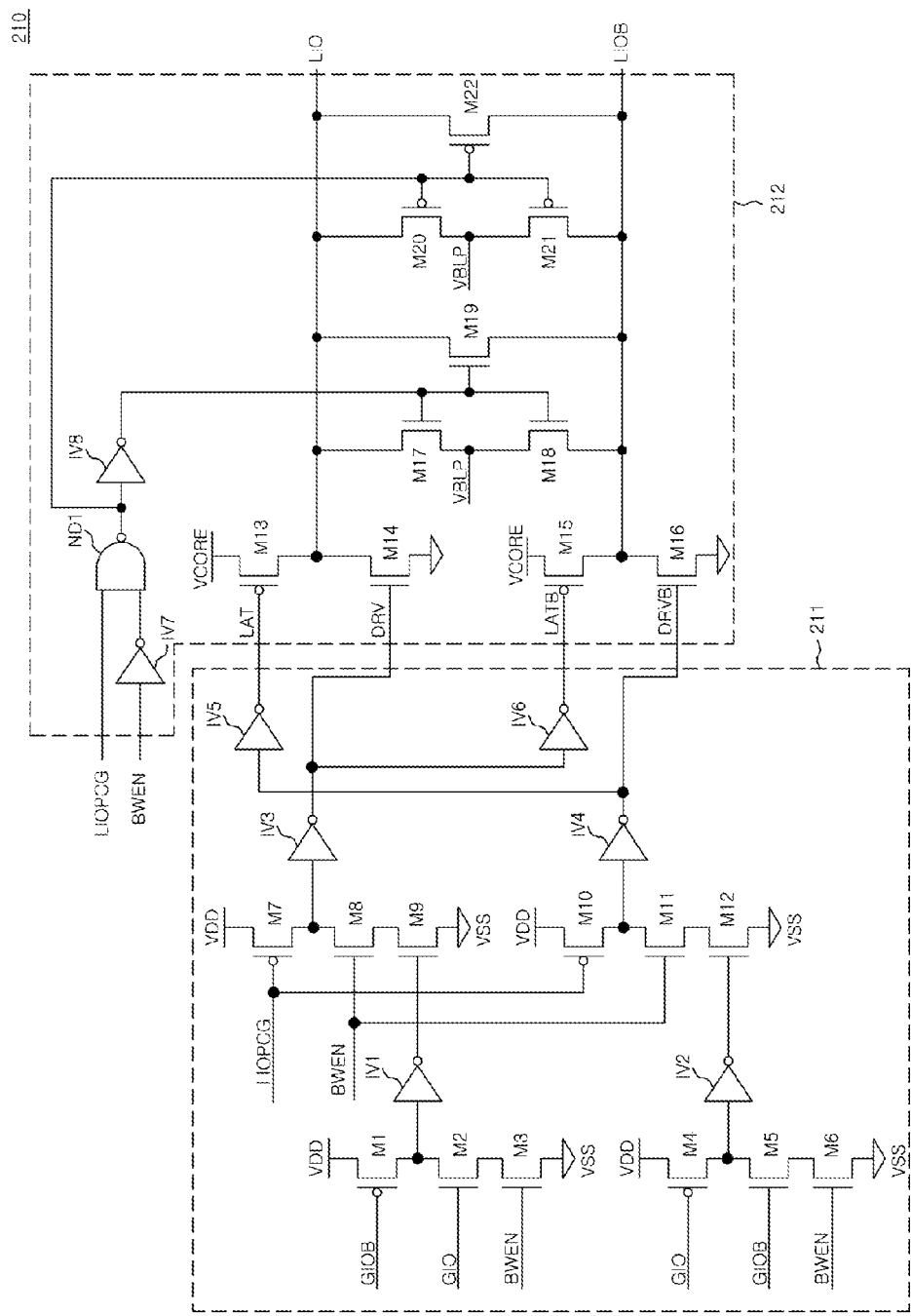
FIG. 3 is a circuit diagram illustrating a write driver that can be included in the apparatus shown in FIG. 2.

In a conventional apparatus, e.g. as shown in FIG. 3, each write driver WDRV has a detecting unit 211 and a driving unit 212. However, in the embodiment of FIG. 4, the write driver includes only the driving units 310 to 340, and the driving units share the driving units 350, the number of which is less than in a conventional apparatus.

A plurality of driving units 310 can be assigned to bank No. 0, a plurality of driving units 320 can be assigned to bank No. 1, a plurality of driving units 330 can be assigned to bank No. 2, and a plurality of driving units 340 can be assigned to bank No. 3.

Among the plurality of driving units 310 to 340, the driving units corresponding to the number of memory banks can share one detecting unit 350.

One of the plurality of detecting units 350 can be assigned to four driving units (one of the driving units 310, one of the driving units 320, one of the driving units 330, and one of the driving units 340).

The driving units 310 and 340 can have the same configuration.

Figure 5:
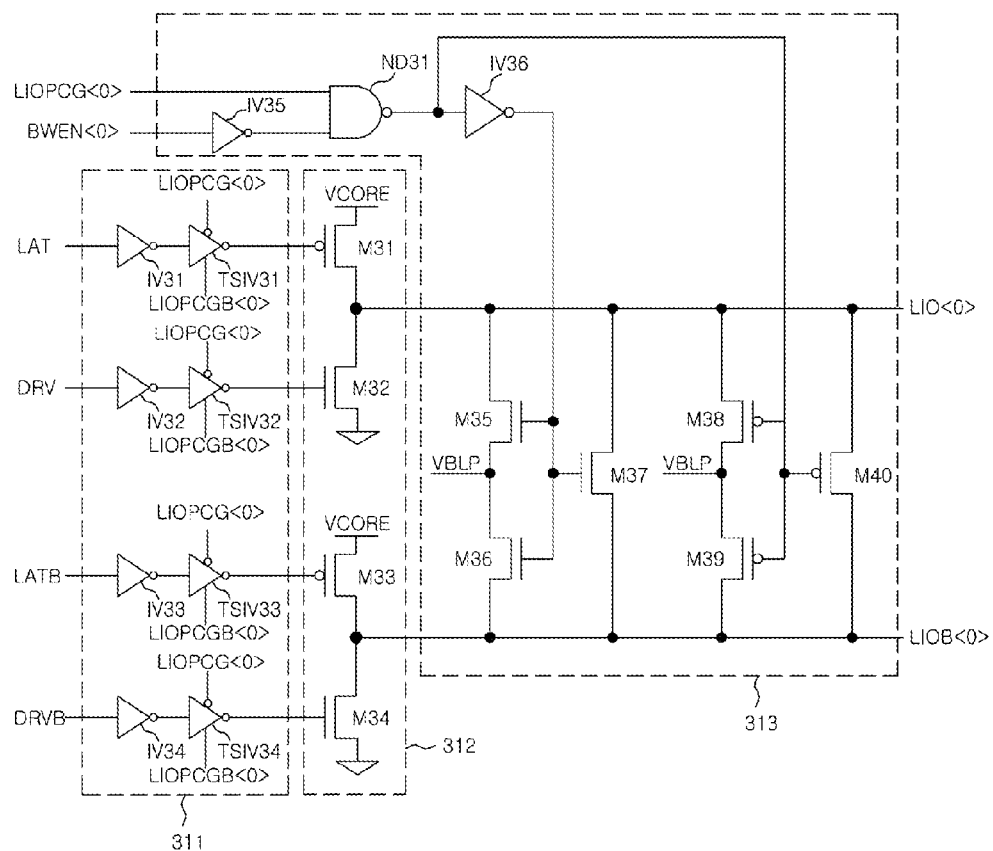
FIG. 5 is a circuit diagram illustrating a driving unit that can be included in the apparatus shown in FIG. 4.

As shown in FIG. 5, each of the driving units 310 can include a determining unit 311, a driver 312, and a pre-charging unit 313.

The determining unit 311 can be configured to output detection signals 'LAT', 'LATB', 'DRV', and 'DRVB' according to whether the bank No. 0 is activated. The determining unit 311 can include a plurality of inverters IV31 to IV34 and a plurality of tree state inverters TSIV31 to TSIV34. The plurality of inverters IV31 and IV34 can be configured to receive the detection signals 'LAT', 'LATB', 'DRV', and 'DRVB', respectively, and invert the received signals. The plurality of tree state inverters TSIV31 to TSIV34 can be configured to invert signals output from the inverters IV31 to IV34 according to the pre-charge signals 'LIOPCG<0>' and 'LIOPCGB<0>', and pass the detection signals 'LAT', 'LATB', 'DRV', and 'DRVB' having the original phases. Depending on the embodiment, pass gates can be used instead of the tree state inverters TSIV31 to TSIV34. When pass gates are used, the plurality of inverters IV31 and IV34 can be removed.

The driver 312 can be configured to drive the local signal lines LIO and LIOB connected to the bank No. 0 to the data level on the basis of the detection signals 'LAT', 'LATB', 'DRV', and 'DRVB' output from the determining unit 311.

The pre-charging unit 313 can be configured to pre-charge the local signal lines LIO and LIOB connected to the bank No. 0 with a bit line pre-charge voltage VBLP in response to the pre-charge signal 'LIOPCG'. In the pre-charging unit 313, when the pre-charge signal 'LIOPCG<0>' is activated at a high level and the bank write enable signal 'BWEN<0>' is deactivated at a low level, a high-level signal can be output from the inverter IV36 to turn on transistors M35 to M40, so that the local signal lines LIO and LIOB can be pre-charged with the bit line pre-charge voltage VBLP.

Figure 6:
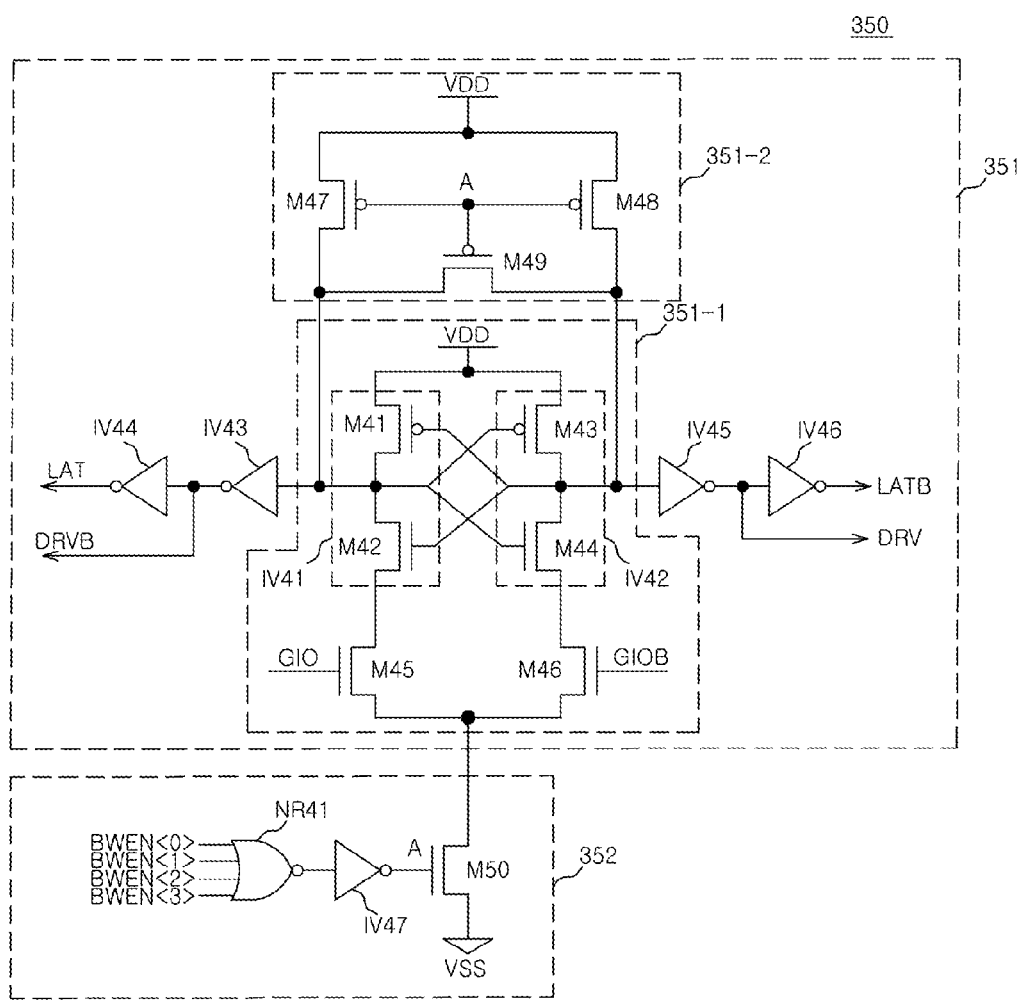
FIG. 6 is a circuit diagram illustrating a detecting unit that can be included in the apparatus shown in FIG. 4.

As shown in FIG. 6, the detecting unit 350 can include a sensor 351 and a sensor controller 352. The detecting unit 350 can comprise a smaller number of transistors than a detecting unit 211 in a conventional apparatus.

The sensor 351 can be configured to detect the transition of data transmitted through global signal lines GIO and GIOB, and output the detection signals 'LAT', 'LATB', 'DRV', and 'DRVB'. The sensor 351 can include an edge detecting unit 351-1, an output controller 351-2, and a plurality of inverters IV43 to IV46.

The edge detecting unit 351-1 can be configured to detect a rising edge or a falling edge according to the transition of the data transmitted through the global signal lines GIO and GIOB, and output the detected edge. The edge detecting unit 351-1 can include first and second inverters IV41 and IV42, and transistors M45 and M46. The first and second inverters IV41 and IV42 can be connected in parallel to a power supply VDD such that an output signal of one of the first and second inverters IV41 and IV42 can be input to an input terminal of the other inverter and the levels of signals output from the output terminals of the two inverters are opposite in phase to each other. The transistors M45 and M46 can be connected to the first and second inverters IV41 and IV42 and operate according to the levels of the global signal lines GIO and GIOB, respectively.

The output controller 351-2 can use an output 'A' of the sensor controller 352 to block the output of the edge detecting unit 351-1. The output control unit 351-2 can include a plurality of transistors M47 to M49 that are configured to maintain the level of an output terminal of the edge detecting unit 351-1 at a predetermined level (for example, a high level) according to the output of the sensor controller 352.

The plurality of inverters IV43 to IV46 can be configured to receive the output of the edge detecting unit 351-1 and output the detection signals 'LAT', 'LATB', 'DRV', and 'DRVB', respectively.

The sensor controller 352 can be configured to determine whether the memory banks (bank Nos. 0 to 3) are activated, on the basis of the bank write enable signals 'BWEN<0:3>', to control the operation of the sensor 351. The sensor controller 352 can be configured to receive the bank write enable signals 'BWEN<0:3>' that are input to all of the memory banks (bank Nos. 0 to 3) and open a current path of the sensor 351 when any one of the received signals is activated. The sensor controller 352 can include a NOR gate NR41, an inverter IV47, and a transistor M50.

The NOR gate NR41 can be configured to receive the bank write enable signals 'BWEN<0:3>'. The inverter IV47 can be configured to receive the output of the NOR gate NR41. The transistor M50 can have a source and a drain that are connected between the sensor 351 and a ground terminal VSS and a gate to which the output of the inverter IV47 is input.

The operations of the write driving circuit having the above-mentioned structure and a semiconductor memory apparatus using the same will be described below.

When a write command is input from the outside of the semiconductor memory apparatus 301, data corresponding thereto is input to the global signal lines GIO and GIOB.

When the data input to the global signal line GIO is at a high level and any one of the bank write enable signal 'BWEN<0:3>' is activated, the sensor controller 352 of the sensor 350 shown in FIG. 6 outputs a high-level signal 'A'. For example, it is assumed that the bank write enable signal 'BWEN<0>' is activated at a high level.

Since the output signal 'A' is at a high level, the transistor M50 is turned on to form a current path, and the transistors M47 to M49 of the output controller 351-2 are turned off to control the sensor 351 to perform a data sensing operation.

In the edge detecting unit 351-1, since the global signal lines GIO and GIOB are at high and low levels, respectively, the transistor M45 is turned on, and the transistor M46 is turned off. Since the global signal lines GIO and GIOB are at the high and low levels, respectively, the transistors M42 and M43 are turned on and the transistors M41 and M44 are turned off, due to the difference between the levels of the gates of the two inverters IV41 and IV42.

Since the transistors M42, M43, and M45 are turned on and the transistors M41, M44, and M46 are turned off, the detecting unit 350 outputs low-level detection signals 'LAT' and 'DRV' and high-level detection signals 'LATB' and 'DRVB'.

Since the bank write enable signal 'BWEN<0>' is in an active state, the pre-charge signal 'LIOPCG<0>' is deactivated.

When the pre-charge signal 'LIOPCG<0>' is deactivated, the tree state inverters TSIV31 to TSIV34 of the determining unit 311 of the driving unit 310 shown in FIG. 5 are turned on, so that the detection signals 'LAT', 'DRV', 'LATB', and 'DRVB' are input to the driver 312.

The driver 312 drives the local signal lines LIO<0> and LIOB<0> to high and low levels, respectively, according to the detection signals 'LAT', 'DRV','LATB', and'DRVB'.

In the pre-charging unit 313, since the pre-charge signal 'LIOPCG<0>' is at a low level and the bank write enable signal 'BWEN<0>' is at a high level, a NAND gate ND31 and the inverter IV36 output a high-level signal and a low-level signal, respectively.

Since the NAND gate ND31 and the inverter IV36 output the high-level signal and the low-level signal, respectively, all of the transistors M35 to M40 are turned off, so that the pre-charging operation is blocked.

Meanwhile, the low-level bank write enable signals 'BWEN<1:3>' and the high-level pre-charge signals 'LIOPCG<1:3>' are input to the memory banks (bank Nos. 1 to 3) in a inactive state, respectively.

Since the low-level bank write enable signals 'BWEN<1:3>' and the high-level pre-charge signals 'LIOPCG<1:3>' are input, the tree state inverters TSIV31 to TSIV34 of the determining unit 311 shown in FIG. 5 are turned off, so that the detection signals 'LAT', 'DRV', 'LATB', and 'DRVB' can not input to the driver 312.

Since the low-level bank write enable signals 'BWEN<1:3>' and the high-level pre-charge signals 'LIOPCG<1:3>' are input, the pre-charging unit 313 pre-charges the local signal lines LIO and LIOB with the bit line pre-charge voltage VBLP.

Figure 7:
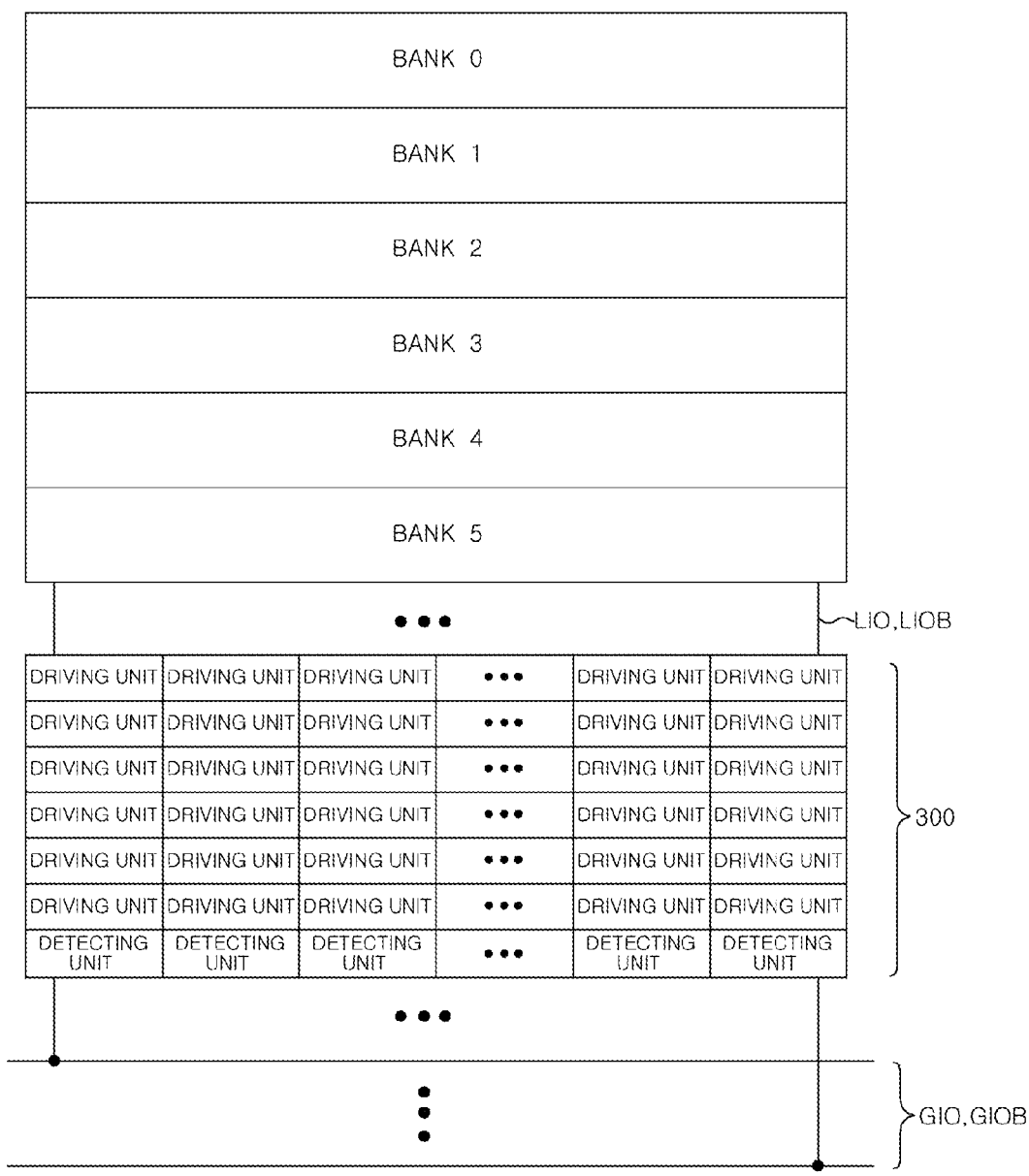
FIG. 7 is a block diagram illustrating an example semiconductor memory apparatus according to another embodiment.

FIG. 7 is a diagram illustrating an example semiconductor memory apparatus having six memory banks according to another embodiment. As shown in FIG. 7, a detecting unit can be provided for every seven driving units. The structures of the driving unit and the detecting unit according to this embodiment can be the same as those shown in FIG. 4. As can be seen from this embodiment shown in FIG. 7, the number of driving units sharing one detecting unit can be changed according to the number of memory banks.

In the write driving unit and the semiconductor memory apparatus according to the above-described embodiments, the driving units can be separated from the detecting units, and the driving units can share the detecting unit, and it is possible to further reduce the size of a detecting structure, and thus reduce the size of the write driver. As a result, it is possible to increase a layout margin, the efficiency of a memory cell, and a net die, and reduce the area of a semiconductor memory apparatus.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A write driving circuit comprising:
 a plurality of driving units configured to write data corresponding to detection signals on memory banks; and
 at least one detecting unit coupled with the plurality of driving units, the detecting unit configured to detect data input from the outside, and output the detection signals to two or more driving units among the plurality of driving units,
 wherein the detecting unit includes:
 a sensor configured to detect the transition of the data and output the detection signal corresponding to the detected result; and
 a sensor controller configured to determine whether the plurality of memory banks are activated, and control the sensor to be operated on the basis of the result of the determination.

2. The write driving circuit of claim 1, wherein the plurality of driving units are configured to be activated in response to at least one of a pre-charge signal and a bank write enable signal.

3. The write driving circuit of claim 1, wherein the detecting unit is configured to be activated in response to a bank write enable signal.

4. The write driving circuit of claim 1, wherein each of the driving units includes:
 a determining unit configured to output the detection signal according to whether the memory bank is activated; and
 a driver configured to drive signal lines connected to the memory bank at a level of the data using the detection signal output from the determining unit.

5. The write driving circuit of claim 4, wherein the determining unit includes a plurality of switching elements whose number is equal to the number of bits of the detection signal and which pass the detection signal according to a pre-charge signal.

6. The write driving circuit of claim 1, wherein the sensor includes:
 an edge detecting unit configured to detect a rising edge or a falling edge according to the transition of the data; and
 an output controller configured to block the output of the edge detecting unit using an output signal of the sensor controller.

7. The write driving circuit of claim 6, wherein the edge detecting unit includes:
 first and second inverting elements that are connected in parallel to a power supply such that an output signal of one of the first and second inverting elements is input to an input terminal of the other inverting element and the phases of signals output from the output terminals of the first and second inverting elements are opposite to each other; and
 first and second switching elements that are connected to the first and second inverting elements and are operated according to the levels of data and inverted data, respectively.

8. The write driving circuit of claim 6, wherein the output controller includes a plurality of switching elements configured to maintain the level of an output terminal of the edge detecting unit at a predetermined level according to the output of the sensor controller.

9. The write driving circuit of claim 1, wherein the sensor controller includes a logic circuit configured to receive a plurality of bank write enable signals generated from the plurality of memory banks, and open a current path of the sensor when any one of the received signals is activated.

10. A semiconductor memory apparatus comprising:
 a plurality of memory banks;
 a detecting-unit-sharing write driving circuit coupled with the plurality of memory banks, the detecting-unit-sharing write driving circuit including:
 a plurality of driving units that are provided in each memory bank, and that are configured to write data on the corresponding memory bank using detection signals when the corresponding memory bank is activated, the number of driving units provided in each memory bank being equal to the number of bits of data written according to one write command, and detecting units that are configured to detect the data when any one of the plurality of memory banks is activated, and output the detection signals to the plurality of driving units; and a plurality of data lines through which the data is transmitted from the detecting-unit-sharing write driving circuit to the plurality of memory banks, wherein the detecting unit includes:

a sensor configured to detect the transition of the data and output the detection signal corresponding to the detected result; and a sensor controller configured to determine whether the plurality of memory banks are activated, and control the sensor to be operated on the basis of the result of the determination.

11. The semiconductor memory apparatus of claim 10, wherein the plurality of driving units are configured to be activated in response to at least one of a pre-charge signal and a bank write enable signal.

12. The semiconductor memory apparatus of claim 10, wherein the detecting units are configured to be activated in response to a bank write enable signal.

13. A semiconductor memory apparatus comprising:

N memory banks each having cells for data recording; and a write driving circuit configured to write data on the N memory banks, wherein the write driving circuit includes:

a plurality of driving units that are provided in each of the N memory bank, and that are configured to determine whether the corresponding memory bank is activated on the basis of first control signals, and to write the data on the corresponding memory bank according to detection signals, the number of driving units provided in each memory bank being equal to the number of bits of the data written according to one write command, and detecting units configured to determine whether the N memory banks are activated on the basis of second control signals, and output the detection signals, and wherein a detecting unit is provided for every N driving units among the plurality of driving units, wherein the detecting unit includes:

a sensor configured to detect the transition of the data and output the detection signal corresponding to the detected result; and a sensor controller configured to determine whether the plurality of memory banks are activated and control the sensor to be operated on the basis of the result of the determination.

14. The semiconductor memory apparatus of claim 13, wherein the first control signal is at least one of a pre-charge signal and a bank write enable signal.

15. The semiconductor memory apparatus of claim 14, wherein different pre-charge signals or bank write enable signals are input to the N memory banks.

16. The semiconductor memory apparatus of claim 13, wherein the second control signals include bank write enable signals.

17. The semiconductor memory apparatus of claim 13, wherein the N driving units are connected to the corresponding N memory banks 18. The semiconductor memory apparatus of claim 13, wherein each of the driving units includes:

a determining unit configured to output the detection signal according to whether the memory bank is activated; and a driver configured to drive signal lines connected to the memory bank at a data level using the detection signal output from the determining unit.

19. The semiconductor memory apparatus of claim 18, wherein the determining unit includes a plurality of switching elements whose number is equal to the number of bits of the detection signal and which pass through the detection signal in response to a pre-charge signal.

20. The semiconductor memory apparatus of claim 13, wherein the sensor includes:

an edge detecting unit configured to detect a rising edge or a falling edge according to the transition of the data; and an output controller configured to block the output of the edge detecting unit using an output signal of the sensor controller.

21. The semiconductor memory apparatus of claim 20, wherein the edge detecting unit includes:

first and second inverting elements that are connected in parallel to a power supply such that an output signal of one of the first and second inverting elements is input to an input terminal of the other inverting element and the phases of signals output from the output terminals of the first and second inverting elements are opposite to each other; and first and second switching elements that are connected to the first and second inverting elements and are operated according to the levels of data and inverted data, respectively.

22. The semiconductor memory apparatus of claim 20, wherein the output controller includes a plurality of switching elements configured to maintain the level of an output terminal of the edge detecting unit at a predetermined level according to the output of the sensor controller.

23. The semiconductor memory apparatus of claim 13, wherein the sensor controller includes a logic circuit configured to receive a plurality of bank write enable signals generated from the plurality of memory banks, and open a current path of the sensor when any one of the received signals is activated.

* * * * *